US009092187B2

(12) United States Patent
Kwong

(10) Patent No.: US 9,092,187 B2
(45) Date of Patent: Jul. 28, 2015

(54) ION IMPLANT INDICIA FOR COVER GLASS OR DISPLAY COMPONENT

(71) Applicant: Apple Inc., Cupertino, CA (US)

(72) Inventor: Kelvin Kwong, San Jose, CA (US)

(73) Assignee: Apple Inc., Cupertino, CA (US)

( * ) Notice: Subject to any disclaimer, the term of this patent is extended or adjusted under 35 U.S.C. 154(b) by 191 days.

(21) Appl. No.: 13/736,676

(22) Filed: Jan. 8, 2013

(65) Prior Publication Data
US 2014/0192467 A1 Jul. 10, 2014

(51) Int. Cl.
*H05K 5/00* (2006.01)
*H05K 7/00* (2006.01)
*G06F 1/16* (2006.01)
*C30B 29/20* (2006.01)
*C30B 31/22* (2006.01)
*H01J 37/317* (2006.01)
*H04M 1/02* (2006.01)
*H04M 19/04* (2006.01)

(52) U.S. Cl.
CPC .............. *G06F 1/1601* (2013.01); *C30B 29/20* (2013.01); *C30B 31/22* (2013.01); *H01J 37/3171* (2013.01); *H04M 1/0266* (2013.01); *H04M 19/048* (2013.01); *H04M 2250/12* (2013.01); *Y10T 428/24851* (2015.01)

(58) Field of Classification Search
CPC ... G06F 1/1601; G06F 1/1613; G06F 1/1626; G06F 1/1633; G06F 2001/133331
USPC ............. 361/679.01, 679.3, 679.56; 200/308, 200/310, 311, 313, 317; 438/407
See application file for complete search history.

(56) References Cited

U.S. PATENT DOCUMENTS

| 4,088,799 A | 5/1978 | Kurtin |
| 4,200,506 A | 4/1980 | Dreschhoff et al. |
| 4,282,290 A | 8/1981 | Pellicori et al. |
| 4,316,385 A | 2/1982 | DeVries et al. |
| 4,732,867 A | 3/1988 | Schnable |
| 5,262,392 A | 11/1993 | Hung et al. |
| 5,702,654 A | 12/1997 | Chen et al. |
| 6,222,194 B1 | 4/2001 | Regan |

(Continued)

FOREIGN PATENT DOCUMENTS

| EP | 1585166 | 10/2005 |
| EP | 2388980 | 11/2011 |

(Continued)

OTHER PUBLICATIONS

Burnett, P.J. et al., "An investigation of ion implantation-induced near-surface stresses and their effects in sapphire and glass," Journal of Materials Science 20, Dec. 1985, vol. 20, Issue 12, 23 pages.

(Continued)

*Primary Examiner* — Anthony Haughton
(74) *Attorney, Agent, or Firm* — Brownstein Hyatt Farber Schreck, LLP

(57) ABSTRACT

An aluminum oxide ceramic is formed into a sapphire component for an electronic device. Indicia are embedded into at least one major surface of the component, for example by ion implantation, where ions are fixed into a subsurface pattern layer. The subsurface pattern layer defines the indicia by altering an optical or chromatic property of the aluminum oxide material, so that the indicia are visible from an external surface of the component.

17 Claims, 6 Drawing Sheets

(56) References Cited

U.S. PATENT DOCUMENTS

| | | | |
|---|---|---|---|
| 6,413,589 | B1 | 7/2002 | Li |
| 6,562,129 | B2 | 5/2003 | Hasegawa et al. |
| 6,982,181 | B2 * | 1/2006 | Hideo .............................. 438/30 |
| 7,305,260 | B2 | 12/2007 | Vuori et al. |
| 7,456,080 | B2 | 11/2008 | Gadkaree |
| 7,478,570 | B2 | 1/2009 | Mian et al. |
| 7,726,532 | B2 | 6/2010 | Gonoe |
| 7,902,527 | B2 | 3/2011 | Chen et al. |
| 7,910,862 | B2 | 3/2011 | Yoshie |
| 8,309,431 | B2 | 11/2012 | Nguyen et al. |
| 8,761,836 | B2 | 6/2014 | Joo |
| 2003/0166311 | A1 | 9/2003 | Miyazawa |
| 2006/0019035 | A1 | 1/2006 | Munz et al. |
| 2006/0060796 | A1 | 3/2006 | Subramanian |
| 2007/0172661 | A1 | 7/2007 | Fechner et al. |
| 2010/0103140 | A1 | 4/2010 | Hansson |
| 2010/0138026 | A1 * | 6/2010 | Kaushal et al. ............... 700/104 |
| 2011/0019123 | A1 | 1/2011 | Prest et al. |
| 2011/0171429 | A1 | 7/2011 | Huang et al. |
| 2011/0200760 | A1 | 8/2011 | Park et al. |
| 2011/0204532 | A1 | 8/2011 | Kinoshita et al. |
| 2011/0312115 | A1 | 12/2011 | Kato |
| 2012/0015799 | A1 | 1/2012 | Shonai |
| 2012/0236526 | A1 | 9/2012 | Weber |

FOREIGN PATENT DOCUMENTS

| | | |
|---|---|---|
| JP | 5795899 | 6/1982 |
| KR | 20040023447 | 3/2004 |
| KR | 20110034889 | 4/2011 |
| KR | 20110039962 | 4/2011 |
| WO | WO2008/122296 | 10/2008 |
| WO | WO2009/128315 | 10/2009 |
| WO | WO2009/151160 | 12/2009 |

OTHER PUBLICATIONS

Demaree JD et al., "Modification of single-crystal sapphire by ion implantation," Nuclear Instruments & Methods in Physics Research, Section—B:Beam Interactions with Materials and Atoms, Elsevier, Amsterdam, NL, vol. 127-128, May 2, 1997, pp. 603-607.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Kobrin, P.H. et al., "Compressive thin films for increased fracture toughness," Proceedings of SPIE, vol. 683, Jan. 1, 1986-Aug. 19, 1986, 5 pages.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

Saito et al., "Coloration of Sapphire by Metal-Ion Implantation," 362 Japanese Journal of Applied Physics, Nov. 24, 1985, No. 11, Part II, Tokyo, Japan.

International Search Report and Written Opinion, PCT Application No. PCT/US2013/078173, 12 pages, May 2, 2014.

Partial European Search Report, EP Application No. 14155530, 8 pages, Jul. 2, 2014.

European Search Report, EP Application No. 14155530, 13 pages, Nov. 6, 2014.

Extended European Search Report, EP Application No. 14150283.1, 5 pages, May 2, 2014.

Extended European Search Report, EP Application No. 14150764, 6 pages, May 2, 2014.

* cited by examiner

ION IMPLANT INDICIA FOR COVER GLASS OR DISPLAY COMPONENT

TECHNICAL FIELD

This subject matter of this disclosure relates generally to cover glass and display components for electronic devices, including portable and stationary electronics applications. In particular, the disclosure relates to indicia and other markings on such cover glass or display components, suitable for use on smartphones, tablet computers, personal digital assistants, media players, displays, and other digital devices.

BACKGROUND

Digital devices typically include a variety of different display and cover glass components, including front and back cover glasses with indicia such as serial numbers, trademarks, control feature labels, and other identifying markings. These indicia raise a number of different design considerations, including clarity, visibility, intelligibility, durability, and stability over periods of extended use, and across a wide range of environmental conditions and operational demands.

These considerations can be particularly relevant in personal electronics and mobile device applications, where shock, impact, scratching, abrasion and other effects pose a variety of different design and engineering challenges. New technologies are required to address these concerns, without suffering from the drawbacks of existing pigment and deposition-based indicia designs.

SUMMARY

This disclosure relates to indicia for cover glass and display components, with application to digital electronic devices. In various examples and embodiments, an aluminum oxide ceramic is formed into a sapphire component for an electronic device. The sapphire component may have first and second major surfaces, with indicia embedded into one or both.

The indicia may be embedded by ion implantation, where ions are fixed in a subsurface pattern layer located between the first and second major surfaces of the sapphire component. The subsurface pattern layer defines the indicia by altering an optical or chromatic property of the aluminum oxide material.

The sapphire component may be assembled into the electronic device with the indicia visible from an exterior surface. The sapphire component may define a cover glass for the device, and the indicia may define a serial number.

The ions fixed into the subsurface pattern layer may be selected from a group consisting of boron, magnesium, titanium, chromium, iron, and copper, and the subsurface pattern layer may define the indicia by changing a color of the aluminum oxide ceramic. The aluminum oxide ceramic may be substantially transparent, absent the subsurface pattern layer defining the indicia.

The sapphire component may be formed with a substantially single crystal plane orientation between the first and second major surfaces. The sapphire component may also form a control surface for the electronic device, and the indicia may include an identifier for the control surface.

In additional examples and embodiments, a sapphire component for an electronic device includes a substantially single crystal aluminum oxide ceramic material, which defines the sapphire component between opposing major surfaces. Indicia may be embedded into a selected surface of the sapphire component, for example by fixing ions into a subsurface pattern layer defined within the sapphire component, beneath the selected surface. The subsurface pattern layer defines the indicia by altering a chromatic property of the ceramic, so that the indicia are visible within the subsurface layer.

The ions fixed into the subsurface pattern layer may be selected from boron, titanium and chromium. For example, the ceramic may comprise corundum and the selected ions may comprise chromium, so that the subsurface pattern layer defines a ruby material within the corundum ceramic. Alternatively, the aluminum oxide ceramic may comprise chromium, so that the subsurface pattern layer defines the indicia in a ruby material.

A mobile device may be assembled with the sapphire component as a cover glass, for example in combination with a display, and the indicia may identify the device manufacturer. Alternatively, a device may be assembled with a digital display and sapphire cover glass component formed of a substantially single crystal aluminum oxide ceramic.

Indicia may be embedded into the sapphire cover glass, visible from the exterior surface, for example by implanting ions into a subsurface pattern layer in which the ions alter a chromatic property of the ceramic. The ions implanted into the subsurface pattern layer may be selected from a group of metals, and different metal ions can be implanted to define the indicia with a plurality of different colors in the pattern layer.

A smartphone can also be assembled from the device. For example, the digital display may include a touchscreen for operation of the smartphone, and the indicia may identify the smartphone make, model or manufacturer.

DETAILED DESCRIPTION

Figure 1:
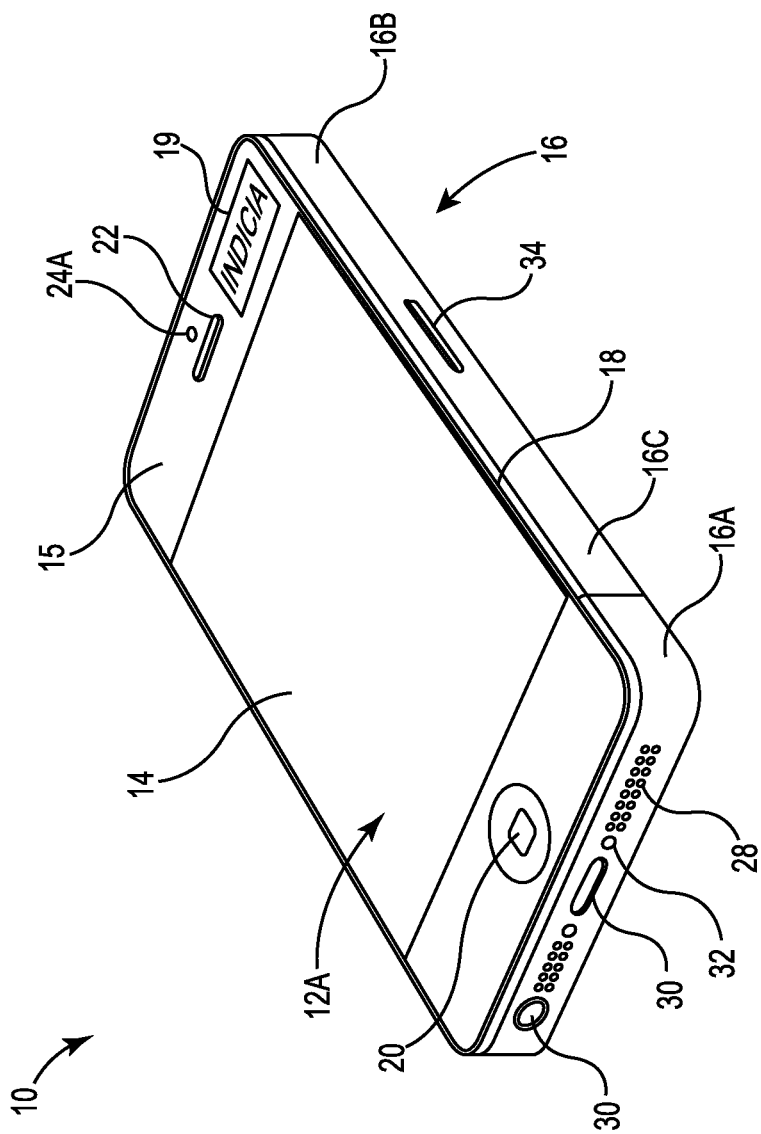
FIG. 1 is a perspective view of an electronic device configured for personal communications, showing the front cover glass and display.
Figure 2A:
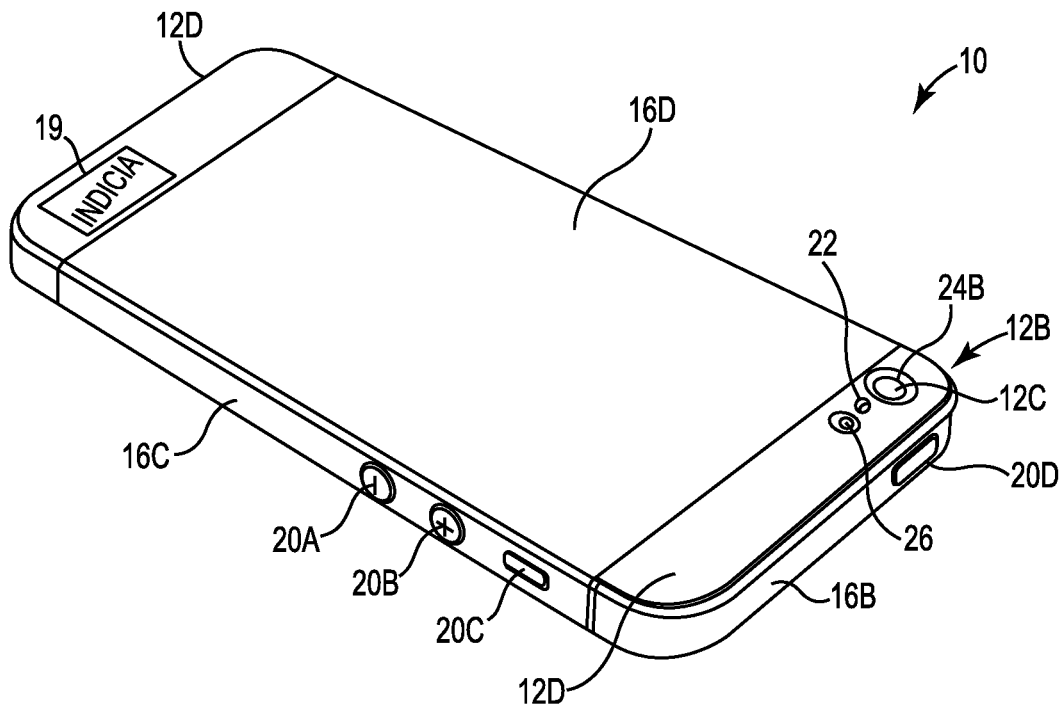
FIG. 2A is a rear perspective view of the device, showing the back cover glass.
Figure 2B:
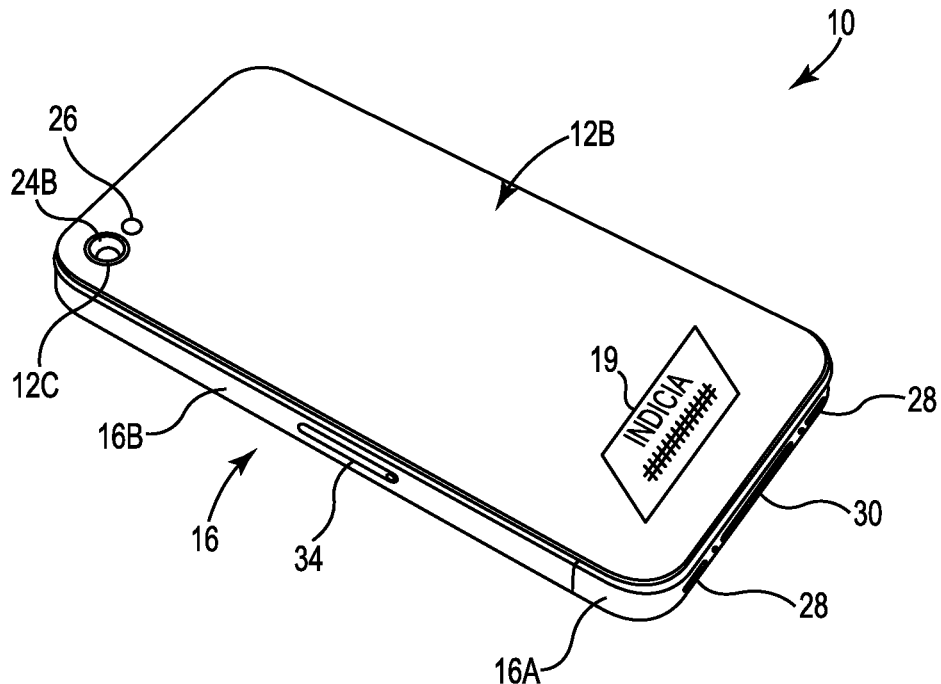
FIG. 2B is an alternate view of the electronic device, with the back cover glass in a different configuration.

FIG. 1 is a perspective view of electronic device 10, in a communications embodiment. As shown in FIG. 1, device 10 includes front cover or cover glass 12A with display window 14 and housing assembly 16, as configured for a mobile phone or smartphone application. Alternatively, device 10 may be configured as a media player, digital assistant, tablet computer, personal computer, computer display, or other electronic device, in either portable or stationary form. FIGS. 2A and 2B are rear perspective views of device 10, showing alternate configurations for back glass 12B and housing 16.

In the particular example of FIG. 1, front cover glass 12A and rear cover glass 12B are coupled to top and bottom housing components 16A and 16B of housing assembly 16 via a bezel or frame assembly 18. One or both of front and rear cover glass components 12A and 12B may also incorporate an aluminum oxide, sapphire crystal, or sapphire glass material, with indicia 19 formed by ion implantation, as described below.

Display window 14 is typically configured for viewing a touch screen or other display component through cover glass 12A, with viewable area defined between border regions 15. Depending on configuration, display window 14 may also accommodate one or more interactive control features, for example a touch screen with a combination of internal or external components for capacitive or resistive coupling across the front surface of cover glass 12A.

Cover glasses 12A and 12B may also accommodate additional control and accessory features, including, but not limited to, a home button or other control device 20, and one or more audio (e.g., speaker or microphone) features 22, sensors or cameras 24A and 24B, and lighting or indicator features 26 (e.g., a flash unit or light emitting diode). Depending on design, additional glass or sapphire based components may also be provided for control and accessory features 20, 22, 24A/B and 26, for example a separate cover glass element 12C for camera 24B in back cover glass 12B.

Housing 16 and frame 18 are typically formed of metal, composites, and durable polymer materials, including metals and metal alloys such as aluminum and stainless steel, durable plastics, and carbon-based or fiber/matrix composites. Housing 16 and frame 18 may either be provided in substantially unitary form, or as discrete components, for example with one or more top, bottom, side and back housing sections 16A, 16B, 16C, and 16D in combination with a unitary or multi-part bezel or frame assembly 18.

Housing 16 and frame 18 can also be configured to accommodate additional accessory features, including, but not limited to, speaker or microphone apertures 28, connector apertures 30 for power, audio, and data communications, mechanical fasteners 32, and access ports 34, e.g., for a subscriber identity module or SIM card, a flash memory device, or other internal component of electronic device 10.

FIG. 2A is a rear perspective view of electronic device 10, with indicia 19 formed in one or more discrete inlay or inset components 12D. Housing 16 is also provided in a multi-part configuration, with bottom housing 16A, top housing 16B, and side housing sections 16C.

Depending on configuration, side housings 16C may be coupled across middle plate 16D to form the back surface of device 10, between back glass insets 12D, as shown in FIG. 2A. Housing components 16A, 16B, and 16C may be provided in either beveled or unbeveled form, and a separate cover glass element 12C may be provided for back camera or sensor 24B, as described above.

FIG. 2B is a perspective view of electronic device 10, showing back glass 12B in a unitary configuration, with two-part housing assembly 16A (bottom) and 16B (top). As shown in FIGS. 2A and 2B, unitary and multi-piece back glass components 12B and 12D may be variously configured to accommodate a range of different indicia 19, control features 20, and accessories including audio features 22, camera or sensor 24B, and a flash unit or lighting/indicator feature 26. Device 10 may also accommodate additional control features, for example volume buttons 20A and 20B, ringer/mute switch 20C, and hold button 20D, as provided in any combination of cover glass components 12A-12D and housing components 16A-16D.

Figure 3:
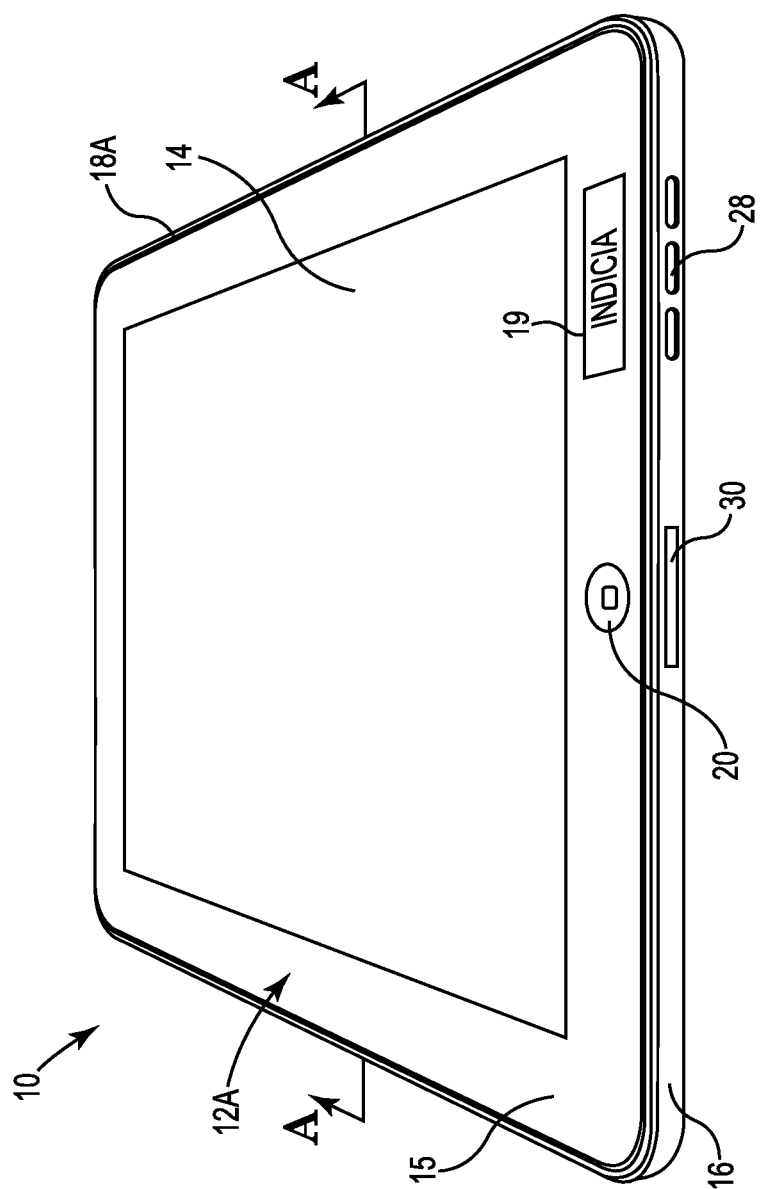
FIG. 3 is a front perspective view of the electronic device, in a media player or tablet computer embodiment.

FIG. 3 is a front perspective view of electronic device 10 in an alternate embodiment, for example a media player, tablet computer, pad computer, or other computing device, or a computer monitor or display. As shown in FIG. 3, front glass 12A is configured to accommodate display window 14, indicia 19, and accessory features including a hold button or other control device 20. Housing assembly 16 may have a substantially unitary configuration, for example as formed together with the back cover of device 10.

As illustrated in FIG. 3, the various horizontal and vertical orientations of device 10 are arbitrary, and designations of the various front, back, top, bottom, and side components may be interchanged without loss of generality. Housing assembly 16 may be coupled to front glass 12A with a substantially internal frame 18 or bezel member 18A, or via in internal groove in unitary housing 16, for example via an adhesive coupling. One or both of housing 16 and frame or bezel 18A may be also formed of a plastic or other durable polymer material, rather than metal, or using metal, plastic polymer, composite materials, or a combination thereof.

Figure 4:
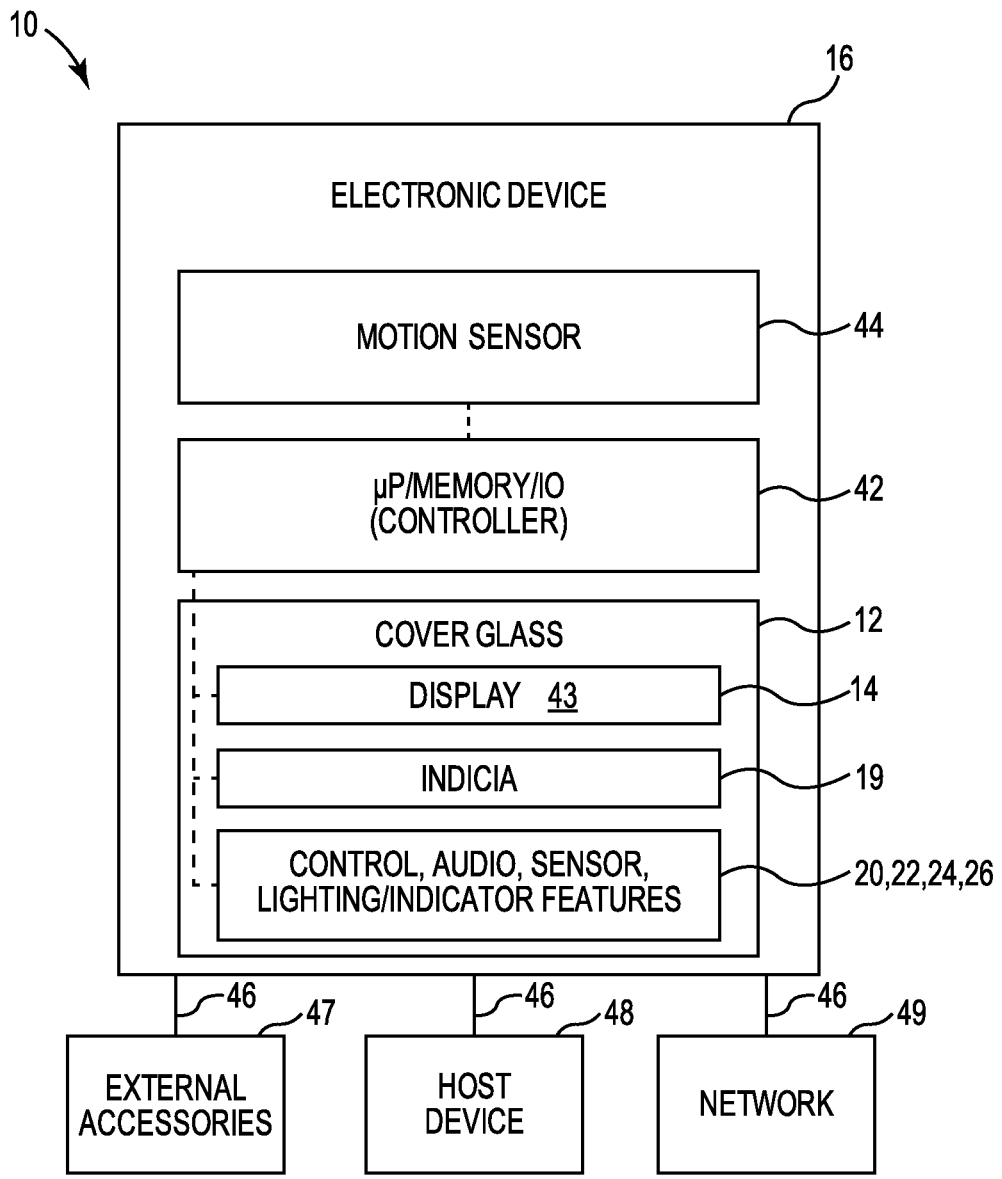
FIG. 4 is a block diagram illustrating internal and external features of the device.

FIG. 4 is a block diagram illustrating various internal and external components of electronic device 10, including microprocessor/controller 42, display 43, an accelerometer or other motion sensor 44, and additional accessories and control features 20, 22, 24, and 26. Device 10 encompasses a range of different portable and stationary electronic applications, as described in FIGS. 1, 2A, 2B, and 3, above, as well as hybrid devices including smartphones with media player capabilities, game players, remote global positioning and telecommunications devices, and laptop, desktop, notebook, handheld and ultraportable computer devices and displays.

As shown in FIG. 4, controller 42 is electronically coupled to display 43, an accelerometer or other motion sensor 44, control devices 20, and accessory features 22, 24, and 26. Various hard-wired and wireless communication connections 46 may be provided to support one or more external accessories 47, host devices 48, and/or networks 49.

Controller 42 includes microprocessor (μp) and memory components configured to execute a combination of operating system and application firmware and software, in order to control device 10 and provide various functionality including, but not limited to, voice communications, voice control, media playback and development, internet browsing, email, messaging, gaming, security, transactions, navigation, and personal assistant functions. Controller 42 may also include a communications interface or other input-output (IO) device configured to support connections 46 to one or more external accessories 47, host devices 48, and network systems 49, including hard-wired, wireless, audio, visual, infrared (IR), and radio frequency (RF) communications.

Display 43 is viewable through front or rear cover glass 12, within display window 14. Cover glass 12 may also accommodate various different control features 20, audio components 22, camera, sensor or other accessory features 24, and lighting or indicator features 26, including, but not limited to, button and switch control features 20A-20D, speaker and microphone features 22, front and rear camera or sensor features 24A and 24B, and LED flash or lighting/indicator features 26, as described above.

Cover glass 12 comprises one or more of front cover glass 12A, back cover glass 12B, lens cover or inset components 12C and 12D, or other components for electronic device 10, as described above. Cover glass 12 is formed of a substantially single-crystal aluminum oxide, sapphire, or sapphire glass material, and provided with ion-implanted indicia 19 to improve clarity, visibility, intelligibility, durability, and stability over a range of different environmental conditions and operational demands, as described below, including increased persistence when exposed to shock, impact, scratching, abrasion, and other effects.

As used herein, the terms "glass" and "cover glass" are not limited to amorphous forms such as silica glass, but also encompass sapphire, sapphire glass, and other aluminum oxide ceramics, in either substantially single-crystal or polycrystalline form. The terms "sapphire" and "sapphire glass" encompass $\alpha$-$Al_2O_3$ and other aluminum oxide materials with varying amounts of trace elements and impurities, including sapphire, corundum, ruby, and ion impregnated or doped aluminum oxide ceramics and sapphire materials.

These definitions reflect usage in the art, in which cover glasses, front glasses, back glasses, glass inlays, glass insets, glass inserts, and other "glass" components may be provided in the form of silica glass, lead crystal, quartz, and other amorphous or polycrystalline forms. These definitions also reflect usage in this disclosure, where cover glasses and other "glass" components may be formed of aluminum oxide ceramics and sapphire materials, in either substantially single-crystal or polycrystalline (e.g., fused polycrystalline) form.

The term "substantially single crystal" encompasses both identically single-crystal and substantially single-crystal forms of sapphire material, as distinguished from amorphous and polycrystalline forms. The term "substantially single crystal" does not does not necessarily imply a fault-free construction, and may include some degree of localized inclusions and lamellar twinning, including crystal plane orientations in which such localized faults, inclusions, and lamellar twinning are present, but in which the same or substantially similar crystal plane orientation is expressed or extant across the structure of the component, or as defined between the first and second (e.g., interior and exterior) major surfaces of the component.

Figure 5A:
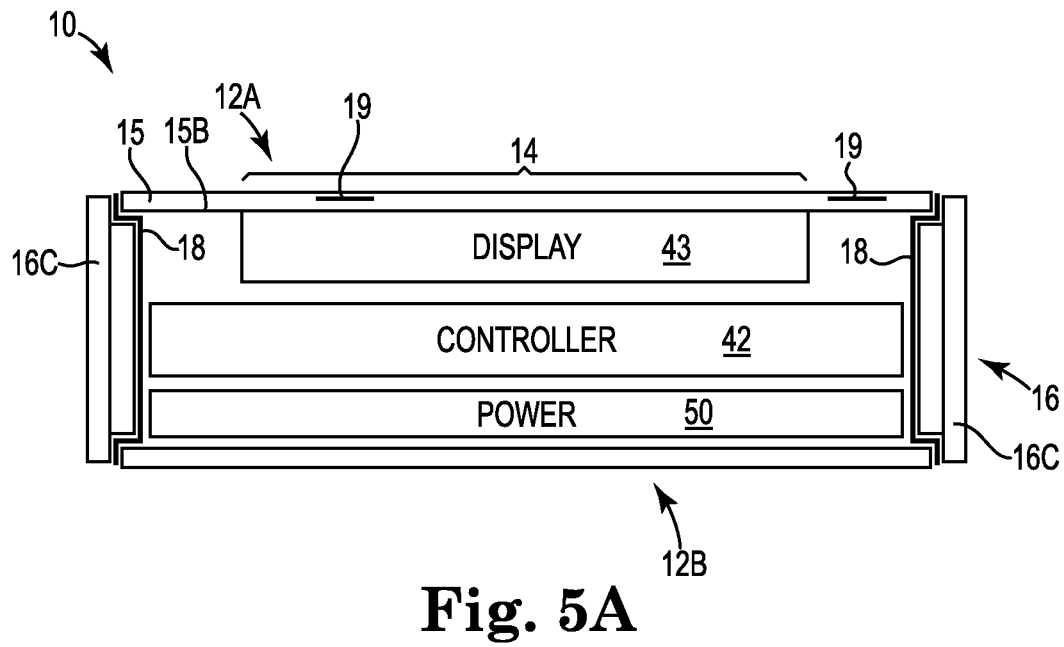
FIG. 5A is a cross-sectional view of the device.

FIG. 5A is a cross-sectional view of electronic device 10, for example as taken along line A-A of FIG. 3, or for any of the other devices 10 as shown in FIGS. 1, 2A, 2B and 4. In this particular configuration, device 10 comprises front glass 12A, back glass 12B, and housing (or housing assembly) 16, with internal components including controller 42, display 43 and a battery or other power source 50.

As shown in FIG. 5A, front glass 12A and back glass 12B are coupled to sides 16C of housing 16, for example via mechanical attachment to frame 18. Controller 42, display 43 and battery 50 are disposed within the interior of device 10, with front glass 12A located in front of (or above) display 10, and back glass 12B located behind (or below) display 43.

Display window 14 is defined as a substantially transparent feature in front glass 12A, in order to observe the viewable area of display 43. Border portions 15 may also be provided, for example via pigment layer 15B on the bottom (interior) surface of cover glass 12A, in order to define the boundaries of display window 14. Back glass 12B may also include one or more transparent display windows 14, for example to accommodate an additional back-side display or indicator, or a camera or other sensor internal to electronic device 10. Alternatively, one or both of back glass 12A and 12B may be substantially opaque.

In this particular configuration, indicia 19 are embedded into front glass 12A of digital electronic device 10, for example by ion implantation. Cover glass 12A (or other sapphire component of device 10) is formed of an aluminum oxide ceramic material, with first and second (e.g., top and bottom, or interior and exterior) major surfaces. Indicia 19 are embedded into at least one selected (e.g. exterior) major surface, by fixing metal ions into a subsurface pattern layer defined below the selected major surface.

Indicia 19 are generated in the subsurface layer by altering an optical property of the aluminum oxide material, for example an optical or chromatic property such as color, opacity or transparency. By embedding indicia 19 in a subsurface layer, below the selected major surface, the effects of abrasion, scratching, and other environmental actions are reduced or substantially eliminated, increasing visibility, clarity, durability, persistence and service life.

Figure 5B:
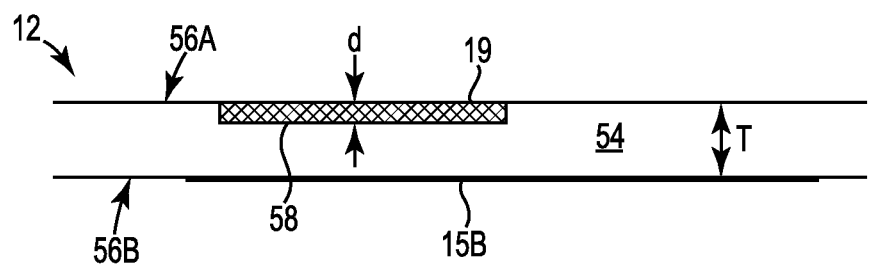
FIG. 5B is a schematic illustration of a cover glass for the device, with ion implanted indicia.

FIG. 5B is a schematic illustration of indicia 19 as embedded in sapphire component 12, for example a front or rear cover glass 12A or 12B, as shown in FIG. 5A, or a lens cover 12C or inset 12D, or another sapphire or sapphire glass component for electronic device 10, as described above. Sapphire component 12 is formed of a ceramic material, for example transparent aluminum oxide ceramic such as corundum, ruby or sapphire, with a substantially single crystal plane orientation extending through inner region 54 of component 12, as defined between first and second major surfaces 56A and 56B. Pigment layer 15B may be provided on one or both surfaces, for example second major surface 56b, opposite indicia 19 in first major surface 56A. Alternatively, pigmentation layer 15B may be absent.

Indicia 19 are formed by ion implantation or other process suitable to embed metal ions into interior 54 of sapphire component 12. The ions are fixed into subsurface layer 58, which extends for depth d beneath selected major surface 56A. Subsurface layer 58 defines indicia 19 by altering the optical and chromatic properties of the transparent ceramic, so that the indicia are visible from selected major surface 56A.

Depending on application, the ions fixed in the subsurface pattern layer are typically selected from a group of metals, for example boron, magnesium, titanium, chromium, iron, and copper. Selection is based on penetration, compatibility with the ceramic material, and the resulting optical and chromatic properties, including transparency, opacity and color.

For example, the ceramic may be substantially formed of an aluminum oxide-based corundum or clear sapphire material, and chromium, titanium, or iron ions may be selected to form indicia 19 as a blue sapphire or ruby colored material, visible within subsurface layer 58 through a substantially clear, transparent, and colorless interior material 54. Alternatively, the ceramic may include chromium, titanium or iron to form a ruby or blue sapphire interior 54, and indicia 19 may be defined with a complementary color or colors in subsurface layer 58.

Sapphire component 12 may be assembled into a mobile device such as smartphone, tablet computer, media player or other digital device 10, as described above, for example as a cover glass or control surface for a touch screen display, or a back glass component. In these applications, indicia 19 may identify a make, model, or manufacturer of the device, or provide a serial number or other identifying information.

Alternatively, sapphire component 12 may be configured as the control surface on a discrete control device, for example a control button or switch 20 or 20A-20D. In these applications, indicia 19 may provide control information, such as a switch label or control indicator. In additional applications, sapphire component 12 may include an aperture for an accessory such as an audio device 22, camera or sensor 24A or 24B, or lighting or indicator feature 26, and indicia 19 may identify the corresponding function.

These techniques contrast with cosmetic artwork designs, which are applied to the front or back side of a cover glass by painting, screen printing, or particle vapor deposition (PVD). Ion implantation, in contrast, bombards component 12 with selected (e.g., metal) ions to embed such artwork and other indicia 19 into selected surface 56A (or 56B), so that the ions are permanently fixed in subsurface layer 58 of sapphire component 12. Different ions (e.g., titanium, chromium, boron, etc.) are selected to generate different degrees of clarity or color in interior region 54, and can be used to alter the appearance of subsurface layer 58 to define indicia 19, visible through selected surface 56A of the cover glass or other component 12.

Overall, ion implantation combined with a sapphire cover glass or other ceramic component 12 can be used to generate cosmetic features, design artwork and other indicia 19 that are robust to environmental conditions, because indicia 19 are defined in subsurface layer 58, and protected from abrasion, scratching, temperature extremes, and other effects. Indicia 19 may also include serial numbers and other identification marks, as described above, in order to indicate the make, model, design, and manufacture date of the device.

Figure 6:
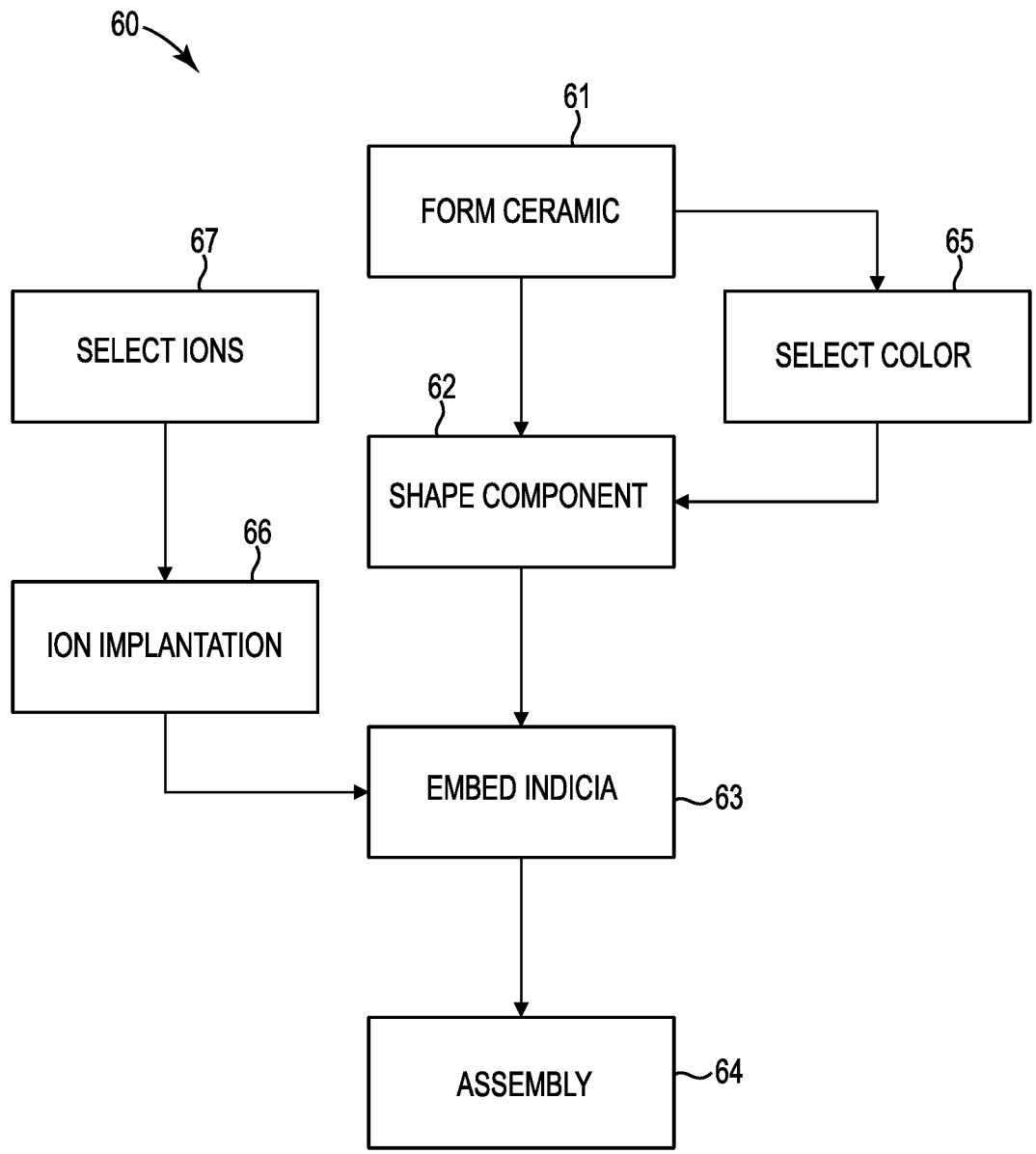
FIG. 6 is block diagram illustrating a method for forming ion implanted indicia in a cover glass, display or control component for an electronic device.

FIG. 6 is a block diagram illustrating method 60 for forming a cover glass or other sapphire component for an electronic device, with embedded indicia. As shown in FIG. 6, method 60 comprises one or more steps of forming an aluminum oxide based ceramic material (step 61), shaping a component from the ceramic (step 62), embedding indicia into the component (step 63), and assembling the component into a digital electronic device (step 64).

Forming the ceramic material (step 61) may comprise sintering and fusing aluminum oxide (alumina; $Al_2O_3$ or $\alpha\text{-}Al_2O_3$) in an inert atmosphere, in order to produce a substantially single crystal transparent ceramic, for example a sapphire, ruby or corundum boule. Typical synthesis processes include, but are not limited to, Verneuil processes, Czochralski processes, and flux methods. Alternatively, a polycrystalline or laminated sapphire material may be utilized.

Color may be selected (step 65) by including particular elements for inclusion in the ceramic, for example metals such as boron, magnesium, titanium, chromium, iron, and copper, in order to generate particular colors or hues of red, blue, yellow, pink, purple, orange or green. Depending upon color selection, the interior of the component may be referred to as clear sapphire or corundum, blue sapphire, ruby, or a special color. Heat treatment can also be utilized to enhance or modify the color selection.

Shaping the component (step 62) comprises cutting, drilling, milling or machining the ceramic (e.g., using industrial diamond tools) to form the selected component, for example a cover glass, lens cover, inset, or other component 12A, 12B, 12C, or 12D, as described above. Generally, the interior of the selected component is defined between major opposing (e.g., interior and exterior) surfaces, and in some configurations the sapphire material may be laminated.

Depending on application, one or more apertures may also be formed in the component, in order to accommodate one or more control or accessory features 20, 20A-20D, 22, 24, 24A, 24B, and 26. Alternatively, the component may be formed as a control surface for a touchscreen, or as discrete control device 20 or 20A-20D.

Embedding the indicia (step 63) comprises implanting or fixing the ions into a subsurface layer or pattern. The subsurface layer defines the indicia by transforming an optical or chromatic property of the ceramic material, for example color, transparency, or opacity. The indicia are visible within the subsurface layer, through the selected surface of the component.

Embedding the indicia may be performed by ion implantation (step 66), or other suitable process. In ion implantation, selected metal ions are accelerated in an electric field, and directed to a selected surface of the component. Typical acceleration voltages are in the range of about 10 kV to about 500 kV, corresponding to penetration depths (and subsurface layer thicknesses t) of a few nm to about 200-300 nm or more, for example up to about 1 µm, depending on ionization number and mass.

Different metal ions may be selected (step 67), based on desired penetration depth and compatibility with the ceramic material. Ions may also be selected based on the resulting optical and chromatic properties, as compared to the corresponding properties of the original ceramic material.

Assembly (step 65) comprises assembling the component into an electronic device, for example a mobile phone, smartphone, computing device, or other mobile or stationary electronic device 10, as described above. The insignia may identify a make, model, or manufacture of the device, or provide a serial number, artwork, industrial design work, or other identifying information.

While this invention has been described with reference to exemplary embodiments, it will be understood by those skilled in the art that various changes may be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited to the particular examples that are disclosed herein, but encompasses all embodiments falling within the scope of the appended claims.

I claim:

1. A sapphire component for an electronic device, the sapphire component comprising:
    a substantially single crystal aluminum oxide ceramic defining the sapphire component between opposing major surfaces; and
    non-transitory indicia embedded into at least one selected major surface of the sapphire component, the indicia comprising ions fixed in a subsurface pattern defined within the sapphire component, beneath the selected major surface;
    wherein the subsurface pattern defines the indicia by altering a chromatic property of the substantially single crystal aluminum oxide ceramic, such that the indicia are visible from the selected major surface.

2. The sapphire component of claim 1, wherein the ions fixed in the subsurface pattern are selected from a group comprising boron, titanium and chromium.

3. The sapphire component of claim 2, wherein the substantially single crystal aluminum oxide ceramic comprises corundum and the selected ions comprise chromium, such that the subsurface pattern defines a ruby material within the corundum ceramic.

4. The sapphire component of claim 1, wherein the substantially single crystal aluminum oxide ceramic comprises chromium, such that the subsurface pattern defines the indicia in a ruby material.

5. A mobile device comprising the sapphire component of claim 1 in combination with a display, wherein the sapphire component comprises a cover glass for the mobile device.

6. The mobile device of claim 5, wherein the indicia identify a manufacturer thereof.

7. The sapphire component of claim 1, wherein the indicia comprises a serial number for the electronic device.

8. The sapphire component of claim 1, wherein the aluminum oxide ceramic is substantially transparent, absent the subsurface pattern defining the indicia.

9. The sapphire component of claim 1, wherein the aluminum oxide ceramic comprises a substantially single crystal plane orientation between the opposing major surfaces.

10. The sapphire component of claim 1, wherein the aluminum oxide ceramic comprises a sapphire control surface for the electronic device.

11. The sapphire component of claim 10, wherein the indicia comprises a control identifier for the sapphire control surface for the electronic device.

12. A device comprising:

a digital display;

a sapphire cover glass component formed of a substantially single crystal aluminum oxide ceramic; and non-transitory indicia embedded in the sapphire cover glass component and visible from an exterior surface thereof, the indicia comprising ions implanted into a subsurface pattern layer defined beneath the external surface, within the substantially single crystal aluminum oxide ceramic;

wherein the ions define the indicia in the subsurface pattern layer by altering a chromatic property of the substantially single crystal aluminum oxide ceramic.

13. The device of claim 12, wherein the ions implanted into the subsurface pattern layer are selected from a group comprising metals.

14. The device of claim 13, wherein different metal ions are implanted into the subsurface pattern layer, such that the indicia are defined with a plurality of different colors in the subsurface pattern layer.

15. The device of claim 12, wherein the digital display comprises a touchscreen.

16. The smartphone of claim 15, wherein the indicia identify a make, model or manufacturer thereof.

17. The device of claim 13, wherein the ions fixed in the subsurface pattern are selected from a group consisting of boron, magnesium, titanium, chromium, iron and copper.

* * * * *